United States Patent
Choe et al.

(10) Patent No.: US 10,236,327 B2
(45) Date of Patent: Mar. 19, 2019

(54) IN-CELL TOUCH ORGANIC LIGHT-EMITTING DISPLAY DEVICE

(71) Applicant: LG Display Co., Ltd., Seoul (KR)

(72) Inventors: Young-Jin Choe, Goyang-si (KR); Nack-Bong Choi, Goyang-si (KR); Se-Jong Yoo, Paju-si (KR); Jong-Hyun Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/798,134

(22) Filed: Oct. 30, 2017

(65) Prior Publication Data

US 2018/0122867 A1 May 3, 2018

(30) Foreign Application Priority Data

Oct. 31, 2016 (KR) ........................ 10-2016-0143980

(51) Int. Cl.
*H01L 27/32* (2006.01)
*G06F 3/041* (2006.01)
(Continued)

(52) U.S. Cl.
CPC ............ *H01L 27/323* (2013.01); *G06F 3/044* (2013.01); *G06F 3/0412* (2013.01); *H01L 51/5203* (2013.01); *G06F 2203/04112* (2013.01)

(58) Field of Classification Search
CPC combination set(s) only.
See application file for complete search history.

(56) References Cited

U.S. PATENT DOCUMENTS

2014/0346027 A1 11/2014 Li et al.
2015/0185942 A1 7/2015 Kim et al.
(Continued)

FOREIGN PATENT DOCUMENTS

CN 105717685 A 6/2016
CN 106648257 A 5/2017
(Continued)

OTHER PUBLICATIONS

European Search Report for European Patent Application No. EP 17199482.5, dated Mar. 23, 2018, 5 Pages.
(Continued)

*Primary Examiner* — Robin J Mishler
(74) *Attorney, Agent, or Firm* — Fenwick & West LLP

(57) ABSTRACT

Disclosed is an organic light-emitting display device that has improved color viewing angle characteristics while including a mesh pattern. The organic light-emitting display device includes an organic light-emitting array including a plurality of pixel openings, and a touch electrode array bonded to the organic light-emitting array. The touch electrode array includes a plurality of first mesh electrodes arranged in a first direction and having a lattice structure, and a plurality of second mesh electrodes arranged in a second direction and having a lattice structure. Each of the first mesh electrodes and the second mesh electrodes includes a plurality of overlapping portions that overlap the pixel openings, and a plurality of non-overlapping portions positioned between the pixel openings. At least some of the overlapping portions include brightness-increasing portions, which are formed of a material different from that of the non-overlapping portions.

12 Claims, 6 Drawing Sheets

(51) Int. Cl.
*H01L 51/52* (2006.01)
*G06F 3/044* (2006.01)

(56) References Cited

U.S. PATENT DOCUMENTS

| | | |
|---|---|---|
| 2015/0261370 A1 | 9/2015 | Yoo et al. |
| 2016/0070406 A1 | 3/2016 | Han et al. |
| 2016/0195983 A1 | 7/2016 | Miyake |
| 2017/0269728 A1* | 9/2017 | Donnelly ................ G06F 3/044 |

FOREIGN PATENT DOCUMENTS

| | | |
|---|---|---|
| JP | 2011-253263 A | 12/2011 |
| JP | 2016-095502 A | 5/2016 |
| WO | WO 2013/157532 A1 | 10/2013 |

OTHER PUBLICATIONS

Japan Patent Office, Office Action, JP Patent Application No. 2017-210539, dated Oct. 23, 2018, four pages.

* cited by examiner

IN-CELL TOUCH ORGANIC LIGHT-EMITTING DISPLAY DEVICE

CROSS-REFERENCE TO RELATED APPLICATIONS

This application claims the benefit of Republic of Korea Patent Application No. 10-2016-0143980, filed on Oct. 31, 2016, which is hereby incorporated by reference in its entirety.

BACKGROUND

Field of Technology

The present disclosure relates to an in-cell touch organic light-emitting display device, and more particularly to an organic light-emitting display device, which has improved viewing angle characteristics while including a metal mesh pattern.

Discussion of the Related Art

An image display device, which realizes various pieces of information on a screen, is a core technology of the information and communication age, and is being developed in the direction of becoming thinner, lighter, more portable, and having higher performance. As a flat panel display device that is capable of overcoming the problems of disadvantageous weight and volume of a cathode ray tube (CRT), for example, an organic light-emitting display device, which displays an image by controlling the intensity of luminescence of an organic emission layer, is attracting attention.

The organic light-emitting display device described above uses a self-illuminating organic light-emitting element, and therefore does not require a separate light source and enables realization of a super-thin-type display. In recent years, research on a touch-panel-integrated display device having an in-cell touch structure, which uses an organic light-emitting element and includes a touch electrode array inside a light-emitting cell, has been actively conducted.

A touch panel includes a first touch electrode, which is arranged in a first direction, and a second touch electrode, which is arranged in a second direction so as to intersect the first touch electrode. The first touch electrode and the second touch electrode are electrically isolated from each other. In this state, when an object charged with static electricity is brought into contact with the touch panel, the touch panel detects a touch input by sensing the change of mutual capacitance between the first touch electrode and the second touch electrode.

In manufacturing an organic light-emitting display device having a flexible touch structure, research is being actively conducted into the application of a metal mesh electrode, having superior flexibility and low resistance characteristics, to a touch electrode.

However, because the metal mesh electrode has higher reflectivity than a transparent conductive material, it has a high possibility of being visible and deteriorates the overall brightness of the organic light-emitting display device.

To solve this problem, a method of aligning a metal mesh electrode with a bank, which is a non-light-emitting region, has been devised. However, there is a high possibility of occurrence of misalignment during a process of accurately aligning a mesh electrode with a display panel. If this misalignment occurs, as a viewing angle increases, the mesh electrode blocks a portion of a pixel opening, which causes asymmetry of a vertical viewing angle or a horizontal viewing angle.

SUMMARY

Accordingly, the present disclosure is directed to an organic light-emitting display device that substantially obviates one or more problems due to limitations and disadvantages of the related art.

An object of the present disclosure is to provide an organic light-emitting display device, which has improved color viewing angle characteristics while including a mesh pattern.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a touch display device includes a light-emitting array including a plurality of pixel openings arranged in a matrix form; and a touch electrode array attached to the light-emitting array, the touch electrode array including: a plurality of first mesh electrodes arranged in a first direction and having multiple lattice portions, at least one first mesh electrode of the plurality of first mesh electrodes including a first portion that overlaps a first pixel opening and a second portion that does not overlap the first pixel opening, the first portion of the at least one first mesh electrode that overlaps the first pixel opening more transparent than the second portion of the at least one first mesh electrode that does not overlap the first pixel opening; and a plurality of second mesh electrodes arranged in a second direction that intersects the first direction and having multiple lattice portions, at least one second mesh electrode of the plurality of second mesh electrodes including a first portion that overlaps a second pixel opening and a second portion that does not overlap the second pixel opening, the first portion of the at least one second mesh electrode that overlaps the second pixel opening more transparent than the second portion of the at least one second mesh electrode that does not overlap the second pixel opening.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the disclosure and together with the description serve to explain the principle of the disclosure.

DETAILED DESCRIPTION

Figure 1:
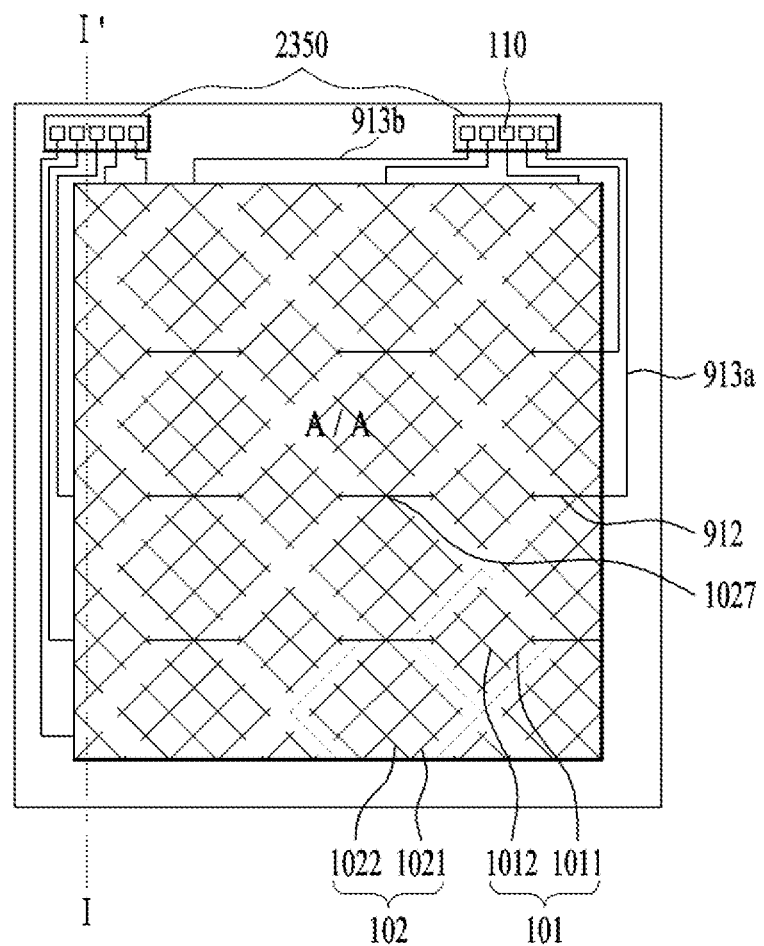
FIG. 1 is a plan view illustrating an organic light-emitting display device according to an embodiment of the present disclosure.

Hereinafter, exemplary embodiments of the present disclosure will be described with reference to the accompanying drawings. Wherever possible, the same reference numbers will be used throughout the drawings to refer to the same or like parts. In addition, in the following description of the embodiments, a detailed description of known functions and configurations incorporated herein will be omitted when it may make the subject matter of the present invention rather unclear. Also, the terms of constituent elements used in the following description are defined taking into consideration ease in the preparation of the specification, and may differ from the terms used to describe elements of actual products.

In the description related to a positional relationship, for example, when an element is referred to as being "on", "above", "under" or "beside" another element, it can be directly on the other element, or intervening elements may also be present.

It will be understood that although the terms "first", "second", "third", etc., may be used herein to describe various elements, these elements should not be limited by these terms. These terms are only used to distinguish one element from another element. Thus, a first element discussed below could be termed a second element without departing from the teachings of example embodiments.

In the drawings, the size and thickness of each constituent element are illustrated merely for convenience of description, and the present invention is not necessarily limited to the illustrated size and thickness of each constituent element.

Hereinafter, various embodiments of the present invention will be described with reference to the accompanying drawings.

FIG. 1 is a plan view for explaining an organic light-emitting display device according to the present disclosure.

An organic light-emitting display device according to an embodiment of the present disclosure includes a plurality of first mesh electrodes 101, which are arranged on a substrate 1000 in a first direction, and a plurality of second mesh electrodes 102, which are arranged in a second direction, which intersects the first direction. In this embodiment, the first direction is defined as the horizontal direction and the second direction is defined as the vertical direction; however, the embodiment is not limited thereto.

Each of the first mesh electrodes 101 and the second mesh electrodes 102 has a multiple-lattice structure. Each of the first mesh electrodes 101 includes a plurality of first line electrodes 1011, which are formed lengthwise in a third direction, and a plurality of second line electrodes 1012, which are formed lengthwise in a fourth direction and intersect the first line electrodes 1011 so as to form the lattice structure. That is, each second line electrode 1012 intersects at least one first line electrode 1011.

Each of the second mesh electrodes 102 includes a plurality of third line electrodes 1021, which are formed lengthwise in the third direction, and a plurality of fourth line electrodes 1022, which are formed lengthwise in the fourth direction and intersect the third line electrodes 1021 so as to form the lattice structure.

The first mesh electrodes 101, which are arranged adjacent to each other in the first direction, are connected to each other via bridges 912. The second mesh electrodes 102, which are arranged adjacent to each other in the second direction, are connected to each other via connecting mesh patterns 1027. Here, the first mesh electrodes 101 connected via the bridges 912 may serve as driving electrodes that apply a driving signal for sensing a touch signal and the second mesh electrodes 102 connected via the connecting mesh patterns 1027 may serve as sensing electrodes that sense a touch signal, or vice versa; however, the embodiment is not limited thereto.

The concrete structures of the first and second mesh electrodes 101 and 102 and the connecting relationship therebetween will be described later.

The first mesh electrodes 101, which are positioned at the outermost portion of a display area A/A, are connected to pad electrodes 110 of a touch pad portion 2350 via first routing lines 913a, and the second mesh electrodes 102, which are positioned at the outermost portion of the display area A/A, are connected to the pad electrodes 110 of the touch pad portion 2350 via second routing lines 913b.

Figure 2:
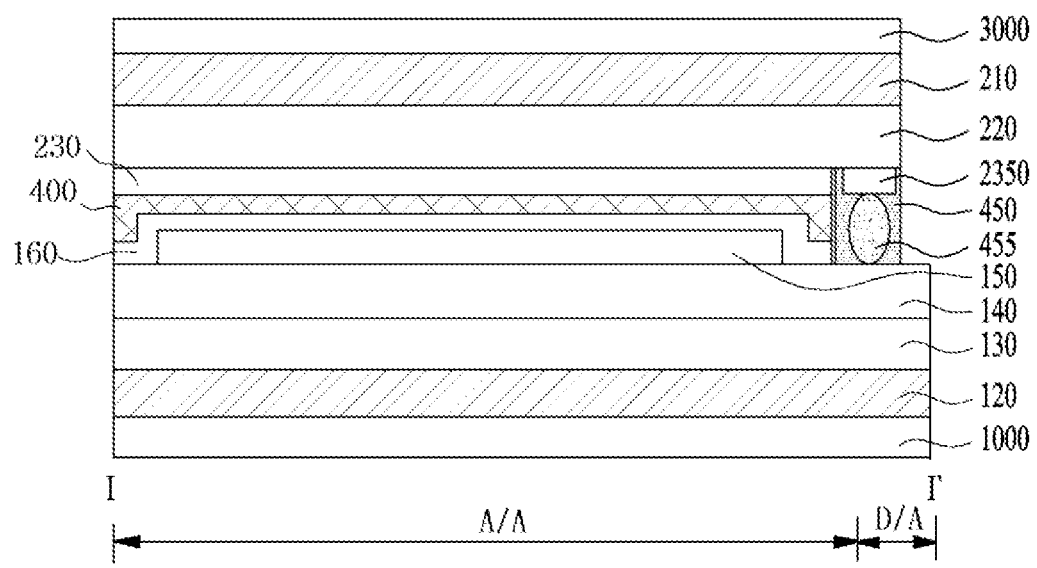
FIG. 2 is a schematic sectional view taken along line I-I' in FIG. 1 according to an embodiment of the present disclosure.

FIG. 2 is a schematic sectional view taken along line I-I' in FIG. 1 according to one embodiment.

The display device according to the embodiment of the present disclosure is constructed such that a first base 120, a first buffer layer 130, a thin-film transistor array 140 and an organic light-emitting array 150 are sequentially disposed on the substrate 1000 and such that a protective layer 160 is disposed so as to cover the organic light-emitting array 150. A second base 210, a second buffer layer 220 and a touch electrode array 230 are arranged inside a cover glass 3000. The touch electrode array 230 is bonded to the protective layer 160, which is disposed on the organic light-emitting array 150, by means of an adhesive layer 400 so as to be opposite the organic light-emitting array 150.

In each of the first buffer layer 130 and the second buffer layer 220, an active area and a dead area are defined. The touch electrode array 230, the organic light-emitting array 150, and the thin-film transistors in the thin-film transistor array 140 excluding the pad portion are formed in the active area. In addition, a touch pad portion 2350 and the pad portion of the thin-film transistor array 140 are defined in a portion of the dead area.

Here, the first and second bases 120 and 210 serve to prevent damage to the internal arrays during a laser irradiation or etching process. In some cases, the substrate 1000 and the cover glass 3000 are omitted, and the first and second bases 120 and 210 serve to protect the display device from external shocks. The first and second bases 120 and 210 may be formed of a polymer material such as, for example, polyimide or photoacryl.

Each of the first buffer layer 130 and the second buffer layer 220 is formed by sequentially stacking the same type of inorganic films, such as an oxide film ($SiO_2$) or a nitride film ($SiN_x$), one above another, or by alternately stacking different inorganic films one above another. The first and second buffer layers 130 and 220 function as barriers that prevent moisture or outside air from permeating the organic light-emitting array 150 in the subsequent process of bonding the upper substrate to the lower substrate.

The touch electrode array 230 and the touch pad portion 2350 are formed on the same surface of the second buffer layer 220. The touch pad portion 2350 is connected to the pad portion (not illustrated) of the thin-film transistor array 140 by a seal 450 having a conductive ball 455, in a vertical bonding process using the adhesive layer 400. At this time, the adhesive layer 400 has a moisture permeation preventing function and is directly in contact with the protective layer 160, which covers the organic light-emitting array 150, thereby serving to prevent outside air from entering the organic light-emitting array 150 and to more reliably prevent the permeation of moisture, in addition to the function of the protective layer 160.

Here, the thin-film transistor array 140 including the pad portion may be configured so as to protrude further than one side of the touch electrode array 230. A driving Integrated Circuit (IC) (not illustrated) may be provided on the protruding portion of the thin-film transistor array 140 to transmit signals for driving the touch electrode array, the thin-film transistor array, and the organic light-emitting array. Although not illustrated, with regard to the driving IC and the thin-film transistor array, a driving pad and a dummy pad include a plurality of dummy electrodes and are connected to the driving IC via wires. In addition, after glass removal, the driving IC may be bonded to and connected to a flexible printed circuit board (FPCB) (not illustrated), thereby being controlled by a micro control unit (MCU) (not illustrated) and a timing controller (not illustrated) provided in the FPCB. The dummy pad is formed in the same layer as the metal that forms a gate line or a data line in the area that corresponds to the touch pad portion 2350 in the dead area around the active area.

The driving IC may be mounted on the flexible printed circuit board and the FPCB may be boned with the display device using an anisotropic conductive film (ACF). Or, the driving IC may be mounted on the thin-film transistor array 140 using the ACF in a chip-on-film (COF) manner.

Although not illustrated, the dummy pad and the driving pad of the thin-film transistor array 140 are connected to the flexible printed circuit board. In addition, the flexible printed circuit board may further include a controller (not illustrated) for controlling the driving IC.

The dummy pad is formed in the same layer as the metal that forms a gate line or a data line in the area that corresponds to the touch pad portion in the dead area around the active area.

Figure 3:
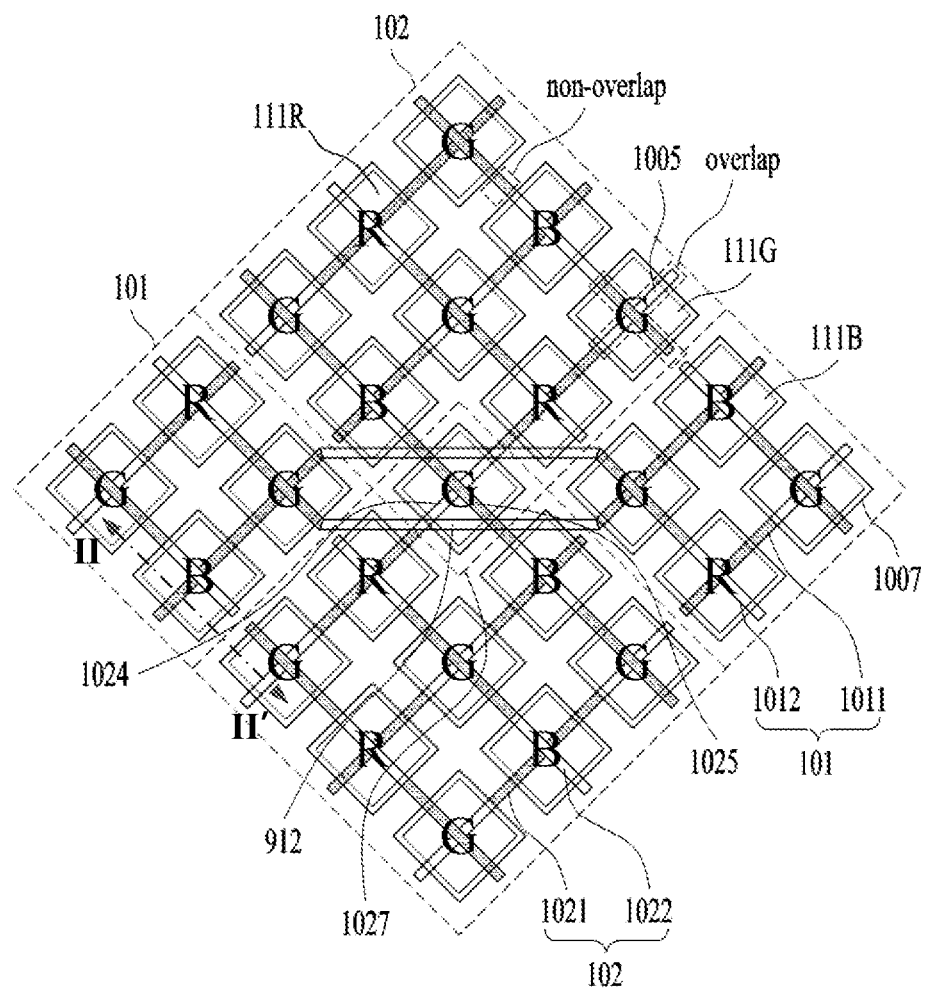
FIG. 3 is a schematic view illustrating the characteristics of first mesh electrodes and second mesh electrodes according to an embodiment.

FIG. 3 is a schematic view illustrating the characteristics of the first mesh electrodes 101 and the second mesh electrodes 102 according to an embodiment.

The first mesh electrodes 101, as described above, include the first and second line electrodes 1011 and 1012, which are arranged in the third and fourth directions so as to intersect each other. The second mesh electrodes 102 include the third and fourth line electrodes 1021 and 1022, which are arranged in the third and fourth directions so as to intersect each other.

The first and second mesh electrodes 101 and 102 may be positioned so as to include portions that overlap the pixel openings 111R, 111G and 111B. Each of the pixel openings 111R, 111G and 111B defines a light emitting portion of each of red, green, and blue organic light emitting elements. The first and second mesh electrodes 101 and 102 may be divided into overlapping portions, which are positioned so as to overlap the pixel openings 111R, 111G and 111B, and non-overlapping portions, which are positioned so as not to overlap the pixel openings 111R, 111G and 111B. Referring to FIG. 3, the overlapping portions are the portions that are indicated by cross-shaped dotted lines, and the non-overlapping portions are the remaining portions.

Although it is illustrated in FIG. 3 that each of the pixel openings 111R, 111G and 111B is formed in a diamond shape, the embodiment is not limited thereto. The pixel openings 111R, 111G and 111B may be formed in various other shapes, such as a rectangular shape, depending on the design.

As shown in FIG. 3, lattice portions, which are formed by the intersection between the first line electrodes 1011 and the second line electrodes 1012 or the intersection between the third line electrodes 1021 and the fourth line electrodes 1022, may be positioned at the overlapping portions; however, the embodiment is not limited thereto. The lattice portions may be positioned at the non-overlapping portions, rather than the overlapping portions, and any one of the first to fourth line electrodes may be positioned so as to pass through the overlapping portions.

At this time, in the case in which the lattice portions are positioned at the centers of the pixel openings 111R, 111G and 111B, the possibility of the lattice portions being visible to the outside is low even when the viewing angle increases. Therefore, in order to improve the viewing angle characteristics, it is desirable for the lattice portions to be positioned at the centers of the pixel openings 111R, 111G and 111B.

All or at least some of the overlapping portions include brightness-increasing portions 1005, which are formed of a material different from that of the non-overlapping portions. The brightness-increasing portions 1005 are formed of a material different from that of the first to fourth line electrodes 1011, 1012, 1021 and 1022 positioned in the portions other than the brightness-increasing portions 1005, such as the non-overlapping portions.

For example, the first to fourth line electrodes 1011, 1012, 1021 and 1022, excluding the brightness-increasing portions 1005, may be formed of metal selected from among Cu, Ag, Al, Mo, To and Au, or an alloy thereof, and the brightness-increasing portions 1005 may be formed of a transparent conductive material such as, for example, ITO, IZO, IGZO or ZnO. However, the embodiment is not limited thereto.

Although the illustration is omitted from FIG. 1 for convenience, segment electrodes 1007 may be further provided at regions corresponding to the overlapping portions. The segment electrodes 1007 are disposed at the positions corresponding to the pixel openings 111R, 111G and 111B and the overlapping portions. The segment electrodes 1007 may be formed of a transparent conductive material such as, for example, ITO, IZO, IGZO or ZnO; however, the embodiment is not limited thereto. The segment electrodes 1007 may be omitted depending on the design. Since the segment electrodes 1007 are formed of a transparent conductive material, they do not block the pixel openings 111, and compensate for the resistance components of the first and second mesh electrodes 101 and 102.

In the case in which the segment electrodes 1007 are positioned on the overlapping portions, the segment electrodes 1007 may be formed of the same material as the brightness-increasing portions 1005 and may be formed integrally therewith.

The brightness-increasing portions 1005, which are formed of a transparent conductive material, have higher resistance characteristics than the non-overlapping portions, which are formed of metal. Therefore, in the case in which an excessively large number of the brightness-increasing portions 1005 are provided, the touch-sensing performance may be degraded. The positions and configuration of the brightness-increasing portions 1005 may be variously set depending on the design.

The brightness-increasing portions 1005 may be formed at the overlapping portions of the first line electrodes 1011 of the first mesh electrodes 101, or may be formed at the overlapping portions of the second line electrodes 1012. Alternatively, the brightness-increasing portions 1005 may be formed at both the overlapping portions of the first line electrodes 1011 and the overlapping portions of the second line electrodes 1012. However, in order to minimize deterioration in resistance-capacitance characteristics, it is desirable that the brightness-increasing portions 1005 be positioned at either the overlapping portions of the first line electrodes 1011 or the overlapping portions of the second line electrodes 1012. Similarly, the brightness-increasing portions 1005 may be formed at the overlapping portions of the third line electrodes 1021 of the second mesh electrodes 102, or may be formed at the overlapping portions of the fourth line electrodes 1022. Alternatively, the brightness-increasing portions 1005 may be formed at both the overlapping portions of the third line electrodes 1021 and the overlapping portions of the fourth line electrodes 1022. However, in order to minimize deterioration in resistance-capacitance characteristics, it is desirable that the brightness-increasing portions 1005 may be positioned at either the overlapping portions of the third line electrodes 1021 or the overlapping portions of the fourth line electrodes 10122.

At this time, one of two neighboring brightness-increasing portions 1005 may be positioned at the overlapping portion of the line electrode that is arranged in the third direction, out of the first to fourth line electrodes, and the other one may be positioned at the overlapping portion of the line electrode that is arranged in the fourth direction. That is, two neighboring brightness-increasing portions 1005 may be arranged in directions different from each other, thereby minimizing deterioration in brightness of the pixel openings 111R, 111G and 111B and improving the viewing angle characteristics.

For example, in the first mesh electrode 101, when the brightness-increasing portion 1005, which is positioned on one pixel opening, is formed at the overlapping portion of the first line electrode 1011, which is arranged in the third direction, the brightness-increasing portion 1005, which is positioned on another neighboring pixel opening, may be formed at the overlapping portion of the second line electrode 1012, which is arranged in the fourth direction.

Further, in the second mesh electrode 102, when the brightness-increasing portion 1005, which is positioned on one pixel opening, is formed at the overlapping portion of the third line electrode 1021, which is arranged in the third direction, the brightness-increasing portion 1005, which is positioned on another neighboring pixel opening, may be formed at the overlapping portion of the fourth line electrode 1022, which is arranged in the fourth direction.

Figure 4:
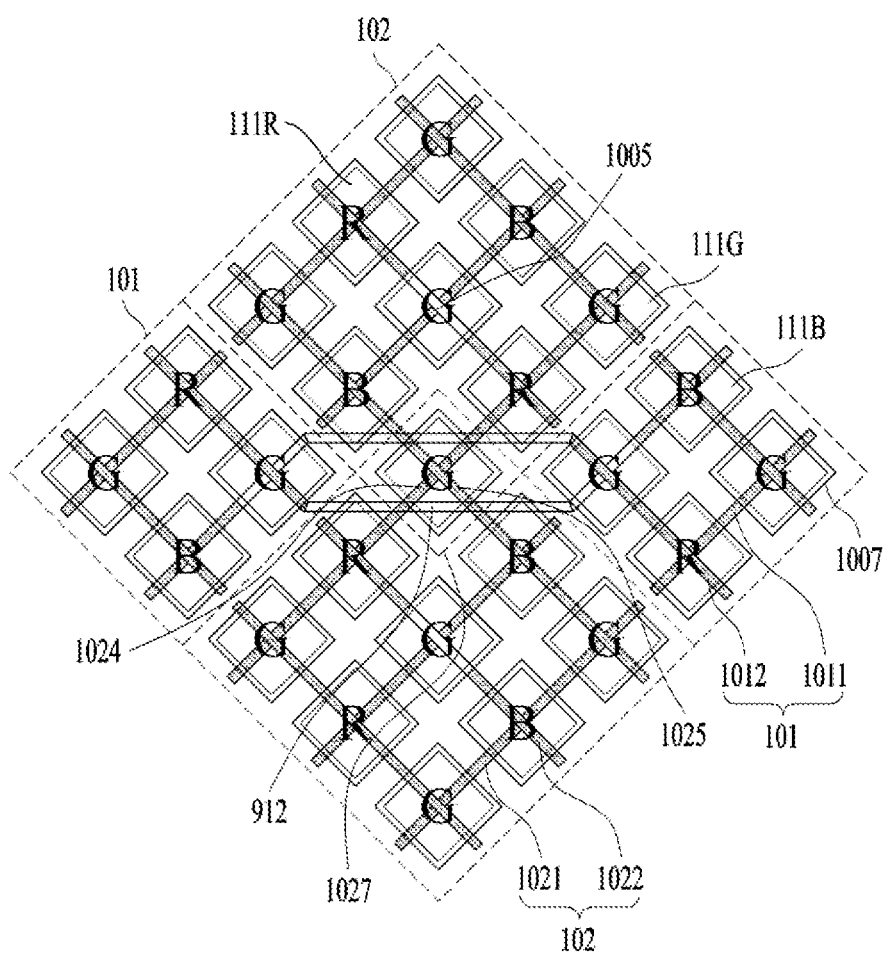
FIG. 4 is a schematic view illustrating the characteristics of first mesh electrodes and second mesh electrodes according to an embodiment.

FIG. 4 is a schematic view illustrating the characteristics of the first mesh electrodes 101 and the second mesh electrodes 102 according to an embodiment.

The brightness-increasing portions 1005 may be formed at all portions of the first and second mesh electrodes 101 and 102 that overlap the pixel openings 111R, 111G and 111B. However, depending on the design, the brightness-increasing portions 1005 may be formed only at some of the overlapping portions.

Particularly, as shown in FIG. 4, the brightness-increasing portions 1005 may be spaced apart from each other, with the k (where k is a natural number) number of overlapping portions interposed therebetween. In other words, the overlapping portions including the brightness-increasing portions 1005 may be spaced apart from each other, with the k number of overlapping portions, which include no brightness-increasing portions, interposed therebetween.

Figure 5:
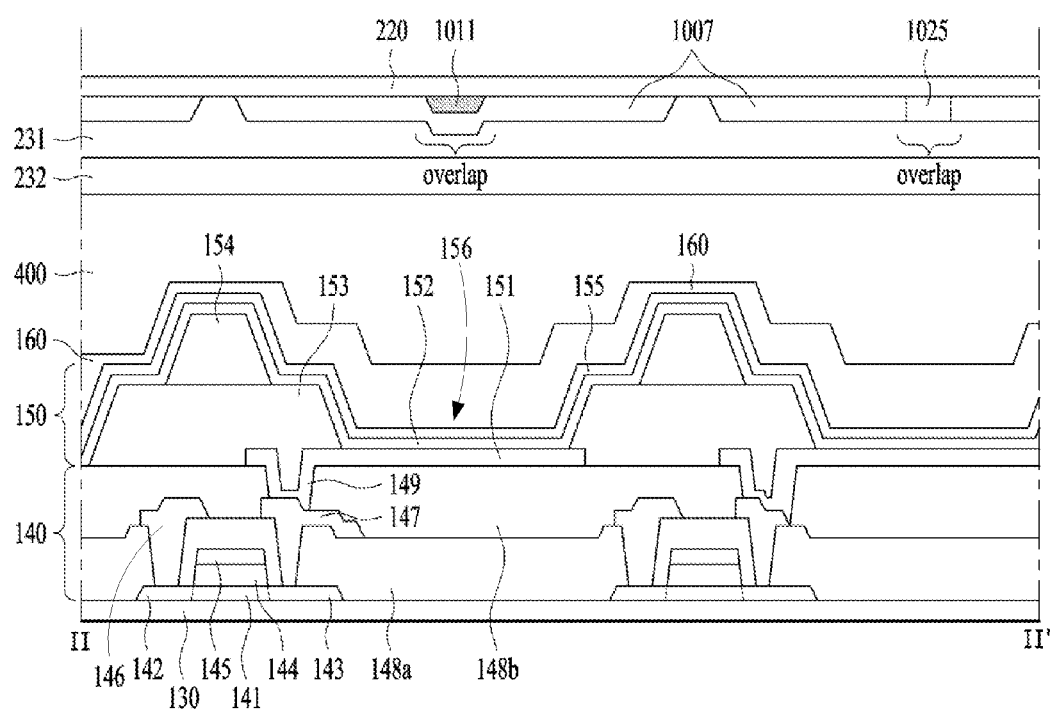
FIG. 5 is a sectional view taken along line II-II' in FIG. 3 according to an embodiment of the present disclosure.

FIG. 5 is a sectional view taken along line II-II' in FIG. 3 to illustrate the cross-sectional structure of the organic light-emitting display device according to an embodiment of the present disclosure. Although the illustration of the structure below the first buffer layer 130 and the structure above the second buffer layer 220 is omitted from the drawings for convenience, as shown in FIG. 2, the first base 120 and the substrate 1000 may be provided below the first buffer layer 130, and the second base 210 and the cover window 3000 may be provided above the second buffer layer 220.

The thin-film transistor array 140, which includes a thin-film transistor (TFT), is disposed on the first buffer layer 130. The thin-film transistor (TFT) includes an active layer 141, which includes a source region 142 and a drain region 143, a gate insulation film 144 and a gate electrode 145, which are disposed on the active layer 141, an interlayer insulation film 148a, which covers the active layer 141 and the gate electrode 145 and has contact holes formed to expose the source and drain regions 142 and 143 therethrough, and a source electrode 146 and a drain electrode 147, which are formed so as to contact the source and drain regions 142 and 143 through the contact holes. A first passivation layer 148b is formed on the thin-film transistor (TFT). The first passivation layer 148b has a contact hole 149 formed to expose the drain electrode 147 therethrough.

A first electrode 151, which is connected to the contact hole 149, is disposed on the first passivation layer 148b. Further, a bank insulation film 153, which defines the pixel opening 111 by exposing a portion of the first electrode 151, is disposed on the first passivation layer 148b. A spacer 154 may be further disposed on the bank insulation film 153.

An organic layer 152, which includes an emission layer, is formed on the first electrode 151. Here, the organic layer 152 is divided into an electron injection layer (EIL), an electron transport layer (ETL), an emission layer (EML), a hole transport layer (HTL), and a hole injection layer (HIL). The emission layer emits light having a specific wavelength as excitons, which are generated by recombination of electrons from a cathode and holes from an anode, return to the ground state.

The organic layer 152 may be formed over the entire surface of the buffer layer 130 including the bank insulation film 153 as well as the first electrode 151. However, the embodiment is not limited thereto.

A second electrode 155 is formed on the organic layer 152. The second electrode 155 may be formed over the entire surface of the buffer layer 130 including the organic layer 152.

The organic light-emitting array 150 is protected from outside moisture by the protective layer 160. The protective layer 160 may be formed by alternately stacking inorganic films and organic films. However, the embodiment is not limited thereto.

The touch electrode array 230 is disposed on the second buffer layer 220. The touch electrode array 230 is bonded to the organic light-emitting array 150 by means of the adhesive layer 400 so as to be opposite the organic light-emitting array 150.

Described in more detail, the first to fourth line electrodes 1011, 1012, 1021 and 1022 are disposed on the surface of the second buffer layer 220 that is opposite the organic light-emitting array 150. At this time, the first to fourth line electrodes 1011, 1012, 1021 and 1022 include overlapping portions that overlap the pixel openings 156. FIG. 5 illustrates the overlapping portion of the first line electrode 1011 that overlaps the pixel opening 156. Some of the overlapping portions of the first to fourth line electrodes 1011, 1012, 1021 and 1022 are provided with the brightness-increasing portions 1005. Referring to FIG. 5, it can be seen that the brightness-increasing portion 1005 is also positioned at the overlapping portion of the third line electrode 1021 that overlaps the pixel opening 156.

Referring to FIG. 5, the segment electrodes 1007 may be further disposed on the first to fourth line electrodes 1011, 1012, 1021 and 1022. The segment electrodes 1007 may be formed of a transparent conductive material. As shown in FIG. 5, the segment electrodes 1007 may be formed of the same material as the brightness-increasing portions 1005, and may be formed integrally therewith. However, the embodiment is not limited thereto. In the case in which the segment electrodes 1007 and the brightness-increasing portions 1005 are formed integrally with each other, no stepped portions are formed between the segment electrodes 1007 and the brightness-increasing portions 1005. As such, by forming the segment electrodes 1007 and the brightness-increasing portions 1005 at the same time, the process of forming the brightness-increasing portions 1005 may be simplified.

The segment electrodes 1007 are disposed at positions corresponding to the pixel openings 156, and are disposed below the first to fourth line electrodes 1011, 1012, 1021 and 1022 so as to cover the overlapping portions. In the case in which the brightness-increasing portions 1005 are provided, the segment electrodes 1007 may be formed of the same material and in the same layer as the brightness-increasing portions 1005.

Figure 6:
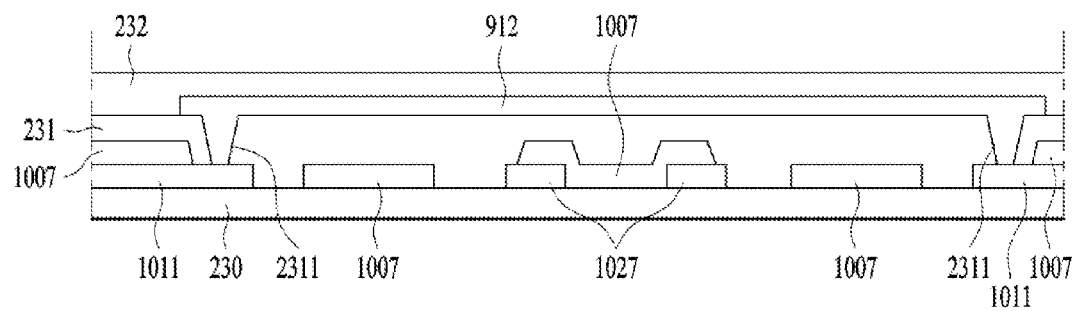
FIG. 6 is a sectional view illustrating the cross-sectional structure according to an embodiment of bridges shown in FIG. 3 according to an embodiment of the present disclosure.
Figure 7:
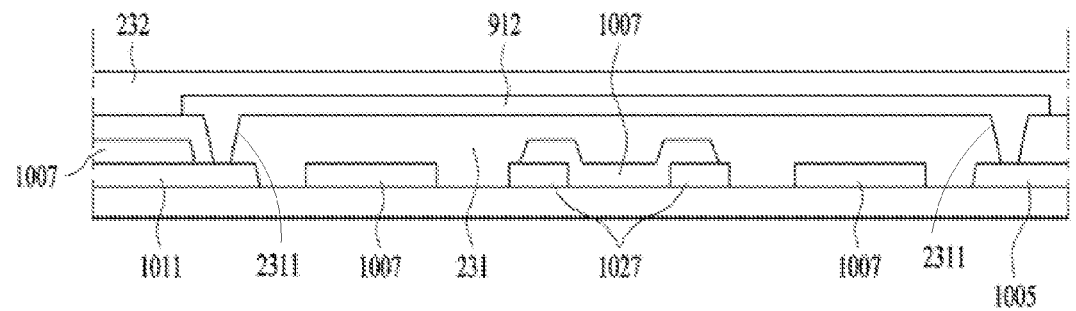
FIG. 7 is a sectional view illustrating the cross-sectional structure according to an embodiment of bridges shown in FIG. 4 according to an embodiment of the present disclosure.

FIGS. 6 and 7 are sectional views illustrating the cross-sectional structures of the bridges 912 shown in FIGS. 3 and 4.

As described above, the connecting mesh patterns 1027 are positioned in the same plane as the first and second mesh electrodes 101 and 102 and connect neighboring second mesh electrodes 102 to each other. The connecting mesh patterns 1027 connect the neighboring second mesh electrodes 102 to each other via line electrodes 1024 and 1025 that are arranged in the third direction and the fourth direction. The connecting mesh patterns 1027 include overlapping portions that overlap the pixel openings 156, and the segment electrodes 1007 are formed at positions corresponding to the overlapping portions. Depending on the embodiment, within the region at which the connecting mesh patterns 1027 overlap the pixel openings, at least one of the line electrodes 1024 and 1025 may be further provided with the brightness-increasing portion, thereby further enhancing the brightness.

A second passivation layer 231 is formed so as to cover the first and second mesh electrodes 101 and 102 and the connecting mesh patterns 1027, and the bridge 912 is formed on the second passivation layer 231. The neighboring first mesh patterns 101 are connected to each other by the bridges 912.

Referring to FIG. 6, the second passivation layer 231 has contact holes 2311 formed to expose the line electrodes 1011 of the first mesh electrodes 101 therethrough. The bridge 912 is connected to the line electrodes 1011 of two neighboring first mesh electrodes 101 through the contact holes 2311, thereby electrically connecting the two neighboring first mesh electrodes 101 to each other.

Meanwhile, the second passivation layer 231, as shown in FIG. 7, may be formed so as to expose the brightness-increasing portion 1005. Specifically, any one contact hole 2311 may expose the brightness-increasing portion 1005 that may be connected to one end portion of the bridge 912, and another contact hole 2311 may expose the line electrode 1011 that may be connected to an opposite end portion of the bridge 912. The bridge 912 may be connected at two opposite end portions thereof to the brightness-increasing portions 1005, or may be connected at two opposite end portions thereof to the line electrodes 1011, or may be connected at one end portion thereof to the brightness-increasing portion 1005 and may be connected at the opposite end portion thereof to the line electrode 1011, thereby electrically connecting the first mesh electrodes 101 to each other.

The bridge 912 has a structure that is covered with the first passivation layer 232.

The touch electrode array 230 shown in FIGS. 6 and 7 is bonded to the organic light-emitting array 150 so as to be opposite the same using the adhesive layer 400. Accordingly, in practice, the touch electrode array 230 is arranged in the state of being vertically inverted from the state shown in FIGS. 6 and 7.

In the above-described in-cell touch organic light-emitting display device according to the embodiments of the present invention, the first and second mesh electrodes 101 and 102 are arranged so as to overlap the pixel openings 111.

In the related art, the mesh electrodes are positioned between the pixel openings. However, in this structure, if an error occurs during an aligning process, the mesh electrodes are positioned to overlap the sides of the pixel openings. Thus, the mesh electrodes block the sides of the pixel openings, thereby causing asymmetry of the viewing angle. On the other hand, according to the embodiments of the present invention, the first and second mesh electrodes 101 and 102 may be positioned so as to overlap the centers of the pixel openings 111. As a result of the first and second mesh electrodes 101 and 102 being positioned at the centers of the pixel openings 111, asymmetry of the viewing angle is prevented.

Even if the first and second mesh electrodes 101 and 102 are slightly misaligned sideways from the centers of the pixel openings 111, the possibility of occurrence of asymmetry of the viewing angle is much lower than the case in which the mesh electrodes block the sides of the pixel openings 111.

Accordingly, the organic light-emitting display device according to the embodiments of the present disclosure has a high process margin compared to the related art, in which the mesh electrodes are positioned between the pixel openings 111. As a result, the in-cell touch organic light-emitting display device according to the embodiments of the present invention has an effect of reducing the degree of asymmetry of the viewing angle attributable to error in the process of aligning the first and second mesh electrodes 101 and 102.

In addition, in order to minimize deterioration in brightness attributable to the first and second mesh electrodes 101 and 102 being positioned on the pixel openings 111, the brightness-increasing portions 1005 are provided at the overlapping portions of the first and second mesh electrodes 101 and 102. Since the brightness-increasing portions 1005 are formed of a transparent conductive material, they have an effect of minimizing deterioration in brightness attributable to the first and second mesh electrodes 101 and 102 overlapping the pixel openings 111.

Specifically, it is possible to minimize deterioration in brightness and resistance by positioning the brightness-increasing portion 1005 at only one of two line electrodes positioned on the pixel opening 111.

The following Table 1 shows the comparison results between the vertical color viewing angle and the horizontal color viewing angle of the organic light-emitting display device according to the embodiments of the present disclosure and those of the related art, in which mesh electrodes do not overlap pixel openings. Even though results different from the following results may be derived in accordance with a difference in processing, the possibility of occurrence of deviation of the viewing angle during processing and the degree of deviation of the viewing angle can be estimated by comparing the maximum deviations measured in the experiment.

TABLE 1

|  | Deviation of Horizontal Color Viewing Angle | Deviation of Vertical Color Viewing Angle |
|---|---|---|
| Prior Art | 6° (Maximum Deviation Measured in Experiment) | 7° (Maximum Deviation Measured in Experiment) |
| Present Invention | 3° (Maximum Deviation Measured in Experiment) | 4.5° (Maximum Deviation Measured in Experiment) |

In the organic light-emitting display device, if the deviation of the viewing angle is 5° or more, the degree of asymmetry of the color viewing angle is considered large.

According to the above experimental results, in the organic light-emitting display device of the related art, the maximum deviation of the horizontal color viewing angle is 6° and the maximum deviation of the vertical color viewing angle is 7°. That is, the related art has a problem in that the degree of asymmetry of the color viewing angle is very large even when a processing error is small, and consequently deterioration in the image quality occurs.

On the other hand, in the organic light-emitting display device according to the embodiments of the present disclosure, the maximum deviation of the horizontal color viewing angle is only 3°, and the maximum deviation of the vertical color viewing angle is only 4.5°. That is, a processing error, if any, has less influence on deviation of the viewing angle.

As is apparent from the above description, in an organic light-emitting display device according to the embodiments of the present invention, since first and second mesh electrodes are positioned so as to overlap pixel openings, it is possible to reduce the degree of asymmetry of a viewing angle attributable to error in the process of aligning the first and second mesh electrodes.

In addition, in order to minimize deterioration in brightness attributable to the first and second mesh electrodes being positioned on the pixel openings, brightness-increasing portions are provided at overlapping portions of the first and second mesh electrodes. Since the brightness-increasing portions are formed of a transparent conductive material, they have an effect of minimizing deterioration in brightness attributable to the first and second mesh electrodes overlapping the pixel openings.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A touch display device comprising:
  a light-emitting array including a plurality of pixel openings arranged in a matrix form; and
  a touch electrode array attached to the light-emitting array, the touch electrode array including:
  a plurality of first mesh electrodes arranged in a first direction and having multiple lattice portions, at least one first mesh electrode of the plurality of first mesh electrodes including a first portion that overlaps a first pixel opening and a second portion that does not overlap the first pixel opening, the first portion of the at least one first mesh electrode that overlaps the first pixel opening more transparent than the second portion of the at least one first mesh electrode that does not overlap the first pixel opening; and
  a plurality of second mesh electrodes arranged in a second direction that intersects the first direction and having multiple lattice portions, at least one second mesh electrode of the plurality of second mesh electrodes including a first portion that overlaps a second pixel opening and a second portion that does not overlap the second pixel opening, the first portion of the at least one second mesh electrode that overlaps the second pixel opening more transparent than the second portion of the at least one second mesh electrode that does not overlap the second pixel opening.

2. The touch display device according to claim 1, wherein the lattice portions of the plurality of first mesh electrodes and the plurality of second mesh electrodes are positioned to overlap the plurality of pixel openings.

3. The touch display device according to claim 2, wherein the plurality of first mesh electrodes include a plurality of first line electrodes arranged in a third direction and a plurality of second line electrodes arranged in a fourth direction, the plurality of first line electrodes intersecting the plurality of second line electrodes forming a lattice structure, and wherein the first portion of the at least one first mesh electrode that overlaps the first pixel opening comprises a portion of at least one first line electrode or at least one second line electrode;
  wherein the plurality of second mesh electrodes include a plurality of third line electrodes arranged in the third direction and a plurality of fourth line electrodes arranged in the fourth direction, the plurality of third line electrodes intersecting the plurality of third line electrodes forming a lattice structure, and wherein the first portion of the at least one second mesh electrode that overlaps the second pixel opening comprises a portion of at least one third line electrode or at least one fourth line electrode.

4. The touch display device according to claim 1, wherein the first mesh electrode and the second mesh electrode are formed of a transparent conductive material.

5. The touch display device according to claim 1, further comprising:
  a plurality of bridges positioned in a different layer from the plurality of first mesh electrodes and the plurality of second mesh electrodes, the plurality of bridges configured to electrically connect together the first mesh electrodes that are arranged adjacent to each other in the first direction through contact holes; and
  a plurality of connecting mesh patterns positioned in a same layer as the plurality of first mesh electrodes and the plurality of second mesh electrodes, the plurality of connecting mesh patterns connecting together the second mesh electrodes that are arranged adjacent to each other in the second direction.

6. The touch display device according to claim 5, wherein at least one of the plurality of connecting mesh patterns comprises a portion that overlaps a pixel opening, the portion of the connection mesh pattern that overlaps the pixel opening more transparent than the second portion of the first mesh electrode that does not overlap the first pixel opening and the second portion of the second mesh electrode that does not overlap the second pixel opening.

7. The touch display device according to claim 3, further comprising:
a plurality of segment electrodes, each segment electrode positioned at a corresponding one of the plurality of pixel openings.

8. The touch display device according to claim 7, wherein the plurality of segment electrodes are formed of a transparent conductive material.

9. The touch display device according to claim 7, wherein the first portion of the first mesh electrode that overlaps the first pixel opening, the first portion of the second mesh electrode that overlaps the second pixel opening, and the plurality of segment electrodes are formed of a same transparent conductive material.

10. The touch display device according to claim 1, wherein the first portion of the first mesh electrode that overlaps the first pixel opening and the first portion of the second mesh electrode that overlaps the second pixel opening are spaced apart from each other, with a k (where k is a natural number) number of portions of other first mesh electrodes and other second mesh electrodes in between the first mesh electrode and the second mesh electrode, the other first mesh electrodes and the other second mesh electrodes less transparent than the first portion of the first mesh electrode that overlaps the first pixel opening and the first portion of the second mesh electrode that overlaps the second pixel opening.

11. The touch display device according to claim 3, wherein the first mesh electrode includes a first neighboring mesh electrode that is adjacent to the first mesh electrode and a second neighboring mesh electrode that is adjacent to the first mesh electrode, the first neighboring mesh electrode including a third portion comprising a line electrode arranged in the third direction that overlaps a third pixel opening, and the second neighboring mesh electrode including a fourth portion comprising a line electrode arranged in the fourth direction that overlaps a fourth pixel opening
wherein the third portion of the first neighboring mesh electrode is more transparent than other portions of the first neighboring mesh electrode that do not overlap the third pixel opening; and
wherein the fourth portion of the second neighboring mesh electrode is more transparent than other portions of the second neighboring mesh electrode that do not overlap the fourth pixel opening.

12. The touch display device according to claim 1, wherein the light-emitting array is an organic light-emitting array.

* * * * *